United States Patent
Shinya et al.

(10) Patent No.: US 11,440,849 B2
(45) Date of Patent: Sep. 13, 2022

(54) SIC CRUCIBLE, SIC SINTERED BODY, AND METHOD OF PRODUCING SIC SINGLE CRYSTAL

(71) Applicant: Shin-Etsu Chemical Co., Ltd., Tokyo (JP)

(72) Inventors: Naofumi Shinya, Fukui (JP); Yu Hamaguchi, Fukui (JP); Norio Yamagata, Fukui (JP); Osamu Yamada, Fukui (JP); Takehisa Minowa, Fukui (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 15/750,459

(22) PCT Filed: Jul. 25, 2016

(86) PCT No.: PCT/JP2016/071673
§ 371 (c)(1),
(2) Date: Feb. 5, 2018

(87) PCT Pub. No.: WO2017/022536
PCT Pub. Date: Feb. 9, 2017

(65) Prior Publication Data
US 2018/0257993 A1      Sep. 13, 2018

(30) Foreign Application Priority Data
Aug. 6, 2015   (JP) .............................. JP2015-156038

(51) Int. Cl.
*C30B 19/02* (2006.01)
*C04B 35/565* (2006.01)
(Continued)

(52) U.S. Cl.
CPC .......... *C04B 35/565* (2013.01); *C01B 32/956* (2017.08); *C04B 35/573* (2013.01);
(Continued)

(58) Field of Classification Search
CPC .......... C30B 29/36; C30B 19/04; C30B 19/02; C30B 9/10; C30B 11/04; C30B 15/10
See application file for complete search history.

(56) References Cited

U.S. PATENT DOCUMENTS 3,053,635 A    9/1962  Shockley
3,278,274 A    10/1966 Liebmann et al.
(Continued)

FOREIGN PATENT DOCUMENTS

CN     102260901 A    11/2011
CN     102597337 A    7/2012
(Continued)

OTHER PUBLICATIONS

Combined Office Action and Search Report dated Feb. 2, 2018 in Chinese Patent Applicant No. 201410741299.6 (With English language translation of categories of cited documents), 8 pages.
(Continued)

*Primary Examiner* — Matthew J Song
(74) *Attorney, Agent, or Firm* — Oblon, McClelland, Maier & Neustadt, L.L.P.

(57) ABSTRACT

In the present invention, in producing a SiC single crystal in accordance with a solution method, a crucible containing SiC as a main component and having an oxygen content of 100 ppm or less is used as the crucible to be used as a container for a Si—C solution. In another embodiment, a sintered body containing SiC as a main component and having an oxygen content of 100 ppm or less is placed in the crucible to be used as a container for a Si—C solution. The SiC crucible and SiC sintered body are obtained by molding
(Continued)

and baking a SiC raw-material powder having an oxygen content of 2000 ppm or less. SiC, which is the main component of these, serves as a source for Si and C and allows Si and C to elute into the Si—C solution by heating.

9 Claims, 9 Drawing Sheets

(51) Int. Cl.
    *C04B 41/88* (2006.01)
    *C30B 19/06* (2006.01)
    *C30B 29/36* (2006.01)
    *C04B 41/85* (2006.01)
    *C30B 35/00* (2006.01)
    *C30B 19/04* (2006.01)
    *C04B 35/573* (2006.01)
    *C30B 15/10* (2006.01)
    *C30B 11/04* (2006.01)
    *C01B 32/956* (2017.01)

(52) U.S. Cl.
    CPC .............. *C04B 41/85* (2013.01); *C04B 41/88* (2013.01); *C30B 11/04* (2013.01); *C30B 15/10* (2013.01); *C30B 19/02* (2013.01); *C30B 19/04* (2013.01); *C30B 19/06* (2013.01); *C30B 29/36* (2013.01); *C30B 35/002* (2013.01); *C04B 2235/3826* (2013.01); *C04B 2235/40* (2013.01); *C04B 2235/402* (2013.01); *C04B 2235/404* (2013.01); *C04B 2235/405* (2013.01); *C04B 2235/407* (2013.01); *C04B 2235/428* (2013.01); *C04B 2235/6585* (2013.01); *C04B 2235/70* (2013.01); *C04B 2235/723* (2013.01)

(56) References Cited

U.S. PATENT DOCUMENTS

| | | | | |
|---|---|---|---|---|
| 4,117,057 A * | 9/1978 | Yajima | ................ | C04B 35/571 264/332 |
| 4,565,600 A * | 1/1986 | Ricard | ................ | C30B 15/08 117/23 |
| 4,853,299 A | 8/1989 | Mizutani et al. | | |
| 6,280,496 B1 * | 8/2001 | Kawai | ................ | B22F 3/17 257/E23.112 |
| 9,945,047 B2 * | 4/2018 | Shinya | ................ | C30B 13/02 |
| 2004/0262821 A1 * | 12/2004 | Odaka | ................ | C04B 35/573 264/682 |
| 2005/0092236 A1 * | 5/2005 | Bender | ................ | C30B 15/22 117/200 |
| 2007/0252267 A1 * | 11/2007 | Omachi | ................ | H01L 23/3731 257/706 |
| 2009/0084309 A1 | 4/2009 | Sakamoto | | |
| 2009/0178610 A1 | 7/2009 | Sakamoto et al. | | |
| 2010/0288187 A1 * | 11/2010 | Terashima | ................ | C30B 29/36 117/73 |
| 2010/0288188 A1 | 11/2010 | Terashima et al. | | |
| 2011/0200833 A1 | 8/2011 | Kamei et al. | | |
| 2012/0107512 A1 * | 5/2012 | Hwang | ................ | C04B 37/006 427/397.7 |
| 2012/0211769 A1 | 8/2012 | Kusunoki et al. | | |
| 2013/0220212 A1 | 8/2013 | Kusunoki et al. | | |
| 2014/0116325 A1 * | 5/2014 | Kamei | ................ | C30B 29/36 117/13 |
| 2014/0127466 A1 | 5/2014 | Danno | | |
| 2014/0356274 A1 | 12/2014 | Han et al. | | |
| 2015/0128847 A1 | 5/2015 | Danno | | |
| 2015/0159297 A1 | 6/2015 | Shinya et al. | | |
| 2015/0159299 A1 | 6/2015 | Shinya et al. | | |

FOREIGN PATENT DOCUMENTS

| | | |
|---|---|---|
| CN | 104695007 A | 6/2015 |
| CN | 104695019 A | 6/2015 |
| EP | 1 445 243 A1 | 8/2004 |
| EP | 1 806 437 | 7/2007 |
| EP | 2 471 981 A1 | 7/2012 |
| EP | 2 722 422 A1 | 4/2014 |
| EP | 2 881 498 A1 | 6/2015 |
| EP | 3 333 288 A1 | 6/2018 |
| JP | 63-17258 A | 1/1988 |
| JP | 4-357167 A | 12/1992 |
| JP | 6-48837 A | 2/1994 |
| JP | 7-172998 A | 7/1995 |
| JP | 8-208336 A | 8/1996 |
| JP | 9-221367 A | 8/1997 |
| JP | 2000-264790 A | 9/2000 |
| JP | 2001-106600 A | 4/2001 |
| JP | 2004-2173 A | 1/2004 |
| JP | 2005-82435 A | 3/2005 |
| JP | 2006-143555 A | 6/2006 |
| JP | 2007-126335 A | 5/2007 |
| JP | 2007-197231 A | 8/2007 |
| JP | 2009-91222 A | 4/2009 |
| JP | 2011-98853 A | 5/2011 |
| JP | 2011-98870 A | 5/2011 |
| JP | 2011-251881 A | 12/2011 |
| JP | 2012-101960 A | 5/2012 |
| JP | 2012-111670 A | 6/2012 |
| JP | 2012-184120 A | 9/2012 |
| JP | 2013-75771 A | 4/2013 |
| JP | 2013-112553 A | 6/2013 |
| JP | 2013-173645 A | 9/2013 |
| JP | 2015-110500 A | 6/2015 |
| JP | 2015-156008 A | 8/2015 |
| JP | 2015-156038 A | 8/2015 |
| JP | 2017-031034 | 2/2017 |
| KR | 10-2012-0041549 A | 5/2012 |
| KR | 10-2021-0061920 | 6/2012 |
| KR | 10-2015-0066459 | 6/2015 |
| WO | WO 2009/090536 A1 | 7/2009 |
| WO | WO 2011/024931 A1 | 3/2011 |
| WO | WO 2011/145387 A1 | 11/2011 |
| WO | WO 2012/176647 A1 | 12/2012 |
| WO | WO 2013/157418 A1 | 10/2013 |

OTHER PUBLICATIONS

Combined Office Action and Search Report dated Feb. 2, 2018 in Chinese Patent Applicant No. 201410737734.8 (With English language translation of categories of cited documents), 7 pages.
International Search Report dated Sep. 13, 2016 in PCT/JP2016/071673 filed Jul. 25, 2016.
"Latest SiC Power Device Technology" Science & Technology Co., Ltd., May 14, 2010, 11 Pages (with English language translation).
Takeshi Yoshikawa, et al., "Solution Growth of Silicon Carbide Using Fe—Si Solvent" Japanese Journal of Applied Physics, vol. 49, XP001554777, 2010, pp. 051302-1-051302-6.
Office Action dated Sep. 11, 2018 in Japanese Patent Application No. 2015-156008.
Extended European Search Report dated Jan. 7, 2019 in the corresponding European Application No. 16 83 2815.1 8 pages.
Extended European Search Report dated Jan. 15, 2019 in the corresponding European Application No. 16 83 2814.4 20 pages.
Office Action dated Feb. 12, 2019 issued in corresponding Japanese patent application No. 2015-156038.
Combined Chinese Office Action and Search Report dated Oct. 23, 2019, in Patent Application No. 201680042594.X, 21 pages (with English translation).
Korean Office Action dated Mar. 23, 2021 in Korean Patent Application No. 10-2014-0171882, 4 pages.
Notice of Allowance dated Jul. 1, 2021, in Korean Patent Application No. 10-2014-0171881.
Office Action dated Sep. 11, 2018, in Japanese Patent Application No. 2015-156038.

(56) References Cited

OTHER PUBLICATIONS

Office Action dated May 12, 2022, in Chinese Patent Application No. 201680042594.X.
J.I. Duffy, "Refactory Materials in US", p. 47, (Jul. 1988) (with English translation).
Korean Office Action dated Jul. 12, 2022, in Korean Patent Application 10-2018-7004560 (with English-language Translation).

* cited by examiner

Seed crystal

Void

Seed crystal

Seed crystal

Seed crystal

Seed crystal

Seed crystal

Seed crystal

Seed crystal

SIC CRUCIBLE, SIC SINTERED BODY, AND METHOD OF PRODUCING SIC SINGLE CRYSTAL

TECHNICAL FIELD

The present invention relates to a technique for growing a crystal of silicon carbide (SiC), and more specifically, to a SiC crucible and SiC sintered body for producing a SiC single crystal, which enables stable production of a high-quality SiC single crystal with few defects for a long time.

BACKGROUND ART

Silicon carbide (SiC) is a material for a wide band-gap semiconductor and having excellent thermal conductivity and chemical stability. In view of transistor characteristics such as breakdown characteristics and saturated drift velocity, SiC has excellent basic physical properties as a power device. For the reasons, it is highly expected that SiC serves as a material for a next-generation power device and also reported that a SiC power device was commercialized.

However, a SiC substrate is expensive, compared to a Si substrate. Besides this, a single-crystal substrate thereof has a problem in that reduction of defects and quality improvement are not sufficient.

The primary reason why it is difficult to produce a high-quality SiC single-crystal substrate with few defects is that SiC cannot melt under normal pressure. In the case of Si, which is widely used as a substrate for semiconductor devices, the melting point thereof under normal pressure is 1414° C. Thus, from the Si melt, a large-diameter single crystal having high-quality and few defects can be obtained in accordance with a CZ method or a FZ method.

In contrast, SiC, if it is heated under normal pressure, sublimates at about 2000° C. Because of this, a crystal growth method according to a CZ method and a FZ method cannot be employed. For the reason, at present, a SiC single crystal is produced mainly by a sublimation method such as an improved Lely method. The sublimation method is only one method for mass-producing a SiC single crystal at present. A SiC single-crystal substrate of 4-inch diameter produced by this method is widely available in the market. It is also reported that a SiC single-crystal substrate of 6 inch-diameter is also mass-produced.

However, even if a power device is manufactured using a SiC single crystal obtained by a sublimation method, it cannot be said that the characteristics of the device are sufficient. This is because reducing defects of a SiC single crystal is not easy. The crystal growth by a sublimation method is a precipitation phenomenon from a gaseous phase, where the growth rate is low and the temperature control within the reaction space is difficult. As a result of recent improvements aggressively made by various R & D institutions, the dislocation density in a micro pipe has been reduced; however, lattice defects such as the threading screw dislocation, edge dislocation and basal plane dislocation, having an effect on the electrical characteristics of a device, are still highly densely present.

Then, a method of growing a silicon carbide crystal according to a solution method has recently come to attract attention (see, for example, Patent Literatures 1 to 3). As mentioned above, SiC itself does not melt under normal pressure. Then, in a method of producing a SiC single crystal in accordance with a solution method, SiC single crystals are obtained as follows: C is allowed to dissolve in the Si melt contained in a graphite crucible, from the high temperature part of the lower portion of the crucible; a SiC seed crystal is brought into contact with the Si—C melt; and a SiC single crystal is allowed to epitaxially grow on the SiC seed crystal. In such a solution method, growth of a SiC crystal proceeds in a state extremely close to thermal equilibrium. Thus, a SiC single crystal with few defects can be obtained compared to SiC single crystal obtained by a sublimation method.

As the solution method for obtaining a SiC single crystal, various types of methods are known. In Non Patent Literature 1 (SiC Power Device Latest Technology), the solution methods are roughly classified into four categories: (a) Traveling Solvent Method (TSM), (b) Slow Cooling Technique (SCT), (c) Vapor Liquid Solid (VLS) method, and (d) Top Seeded Solution Growth (TSSG) method. The term "solution method" used in the specification refers to the Top Seeded Solution Growth (TSSG) method.

In the method of producing a SiC single crystal in accordance with the solution method, a Si melt is formed in a graphite crucible. Since the solubility of C in the Si melt is extremely low (about 1 at %), usually, e.g., a transition metal, is added to the Si melt in order to facilitate dissolution of C (see, for example, Patent Literatures 1 to 3). As the element to be added, transition metals such as Ti, Cr, Ni and Fe, low melting-point metals such as Al, Sn and Ga, and rare earth elements are reported.

The type and amount of addition element are determined in consideration of e.g., the following items: facilitating dissolution of C; precipitating SiC from a solution as a primary crystal and successfully equilibrating the remainder as a liquid phase; inhibiting precipitation of a carbide and other phases by the addition element; stably precipitating a desired one of the SiC crystal polymorphisms; and preparing a solution composition increasing the growth rate of a single crystal as much as possible.

Growth of a SiC single crystal in accordance with a solution method conventionally used is usually carried out in accordance with the following procedure. First, a Si material is placed in a crucible made of carbon or graphite and heated under an inert gas atmosphere to melt. A component C is supplied into the Si melt from the crucible to prepare a Si—C solution. Alternatively, a case where a carbon compound together with the Si material are placed in a crucible and melted, is known. After a component C is sufficiently dissolved in the Si—C solution, a SiC seed single crystal is brought into contact with the solution and a single crystal is allowed to grow by use of temperature gradient formed over the whole solution.

However, such a conventional solution method has the following problems.

A first problem is that a Si component gradually runs out from the Si—C solution as growth of a SiC single crystal proceeds, with the result that the composition of the solution gradually changes. If the composition of the solution changes during the growth of a SiC single crystal, naturally the precipitation environment of SiC changes. As a result, it becomes difficult to continue the growth of a SiC single crystal stably for a long time.

A second problem is excessive melting of C from a crucible. As the growth of a SiC single crystal proceeds, a Si component gradually runs out from a Si—C solution; whereas C is continuously supplied from a crucible. Because of this, relatively C excessively melts into the Si—C solution, with the result that the Si/C composition ratio in the solution changes.

A third problem is precipitation of a SiC polycrystal on the surface (inner-wall surface) of a crucible in contact with the Si—C solution. As mentioned above, if C excessively melts into the Si—C solution from a crucible, fine SiC polycrystals are easily generated on the inner-wall surface of the crucible. Such a SiC polycrystal (dust crystal) floats in the SiC solution, reaches the portion in the vicinity of the solid-liquid interface of a growing SiC single crystal and the Si—C solution, thereby inhibiting growth of the single crystal.

CITATION LIST

Patent Literature

Patent Literature 1: Japanese Patent Laid-Open No. 2000-264790
Patent Literature 2: Japanese Patent Laid-Open No. 2004-002173
Patent Literature 3: Japanese Patent Laid-Open No. 2006-143555

Non Patent Literature

Non Patent Literature 1: "SiC Power Device Latest Technology", first section, 1.2 SiC solution growth method, pages 41 to 43 (Science & Technology Co., Ltd., published on May 14, 2010).

SUMMARY OF INVENTION

Technical Problem

The present invention was made in consideration of the above problems with conventional methods. An object of the invention is to provide a technique for obtaining a high-quality SiC single crystal with few defects by reducing a composition variation of a Si—C solution compared to a method using a conventional graphite crucible, and suppressing precipitation of a polycrystal on the inner wall of a crucible.

Solution to Problem

To solve the aforementioned problems, the crucible or sintered body according to the present invention is the crucible or sintered body to be used for growing a silicon carbide crystal in accordance with a solution method, having an oxygen content of 100 ppm or less and containing SiC as a main component.

Such a crucible or sintered body is produced by molding a SiC raw-material powder having an oxygen content of 2000 ppm or less and then baking the molding to reduce the oxygen content to 100 ppm or less.

Preferably, a heat treatment for impregnating the crucible or sintered body with Si is further applied.

A method of producing a SiC single crystal according to a first embodiment of the present invention, which is a method of growing a silicon carbide crystal in accordance with a solution method, characterized by using a crucible as mentioned above as a container for a Si—C solution; heating the crucible to allow Si and C derived from a source, i.e., SiC, which is a main component of the crucible, to elute from a high temperature region of the crucible surface in contact with the Si—C solution, into the Si—C solution; and bringing a SiC seed crystal from the top of the crucible into contact with the Si—C solution to allow a SiC single crystal to grow on the SiC seed crystal.

A method of producing a SiC single crystal according to a second embodiment of the present invention is a method of growing a silicon carbide crystal in accordance with a solution method, characterized by placing a sintered body as mentioned above in a crucible serving as a container for a Si—C solution; heating the crucible to allow Si and C derived from a source, i.e., SiC, which is a main component of the sintered body, to elute from the surface of the sintered body in contact with the Si—C solution, into the Si—C solution; and bringing a SiC seed crystal from the top of the crucible into contact with the Si—C solution to allow a SiC single crystal to grow on the SiC seed crystal.

It is preferable that a metal element M, which has an effect of enhancing the solubility of C to the Si—C solution, is added to the Si—C solution in advance.

The metal M is at least one of a first metal element M1 (M1 is at least one metal element selected from the group consisting of La, Ce, Pr, Nd, Sm, Eu, Gd, Tb, Dy, Ho and Lu), and a second metal element M2 (M2 is at least one element selected from the group consisting of Ti, V, Cr, Mn, Fe, Co, Ni and Cu).

It is preferable that both the first metal element M1 and the second metal element M2 are used as the metal M. The total content of the metal M in the Si—C solution is specified as 1 at % to 80 at %.

Preferably, the method of growing a silicon carbide crystal according to claim 8, wherein the content of the first metal element M1 in the Si—C solution is specified as 10 at % or more; and the content of the second metal element M2 in the Si—C solution is specified as 1 at % or more.

In another embodiment, the metal M is at least one metal element selected from the group consisting of Al, Ga, Ge, Sn, Pb and Zn.

It is preferable that the temperature of the Si—C solution is controlled to fall within the range of 1300° C. to 2300° C. by the heating.

In another embodiment, the heating is performed in the state where the crucible is housed in a second crucible made of a heat-resistant carbon material.

Advantageous Effects of Invention

In the present invention, in producing a SiC single crystal in accordance with a solution method, a crucible containing SiC as a main component and having an oxygen content of 100 ppm or less, is used as the crucible to be used as a container for a Si—C solution. In another embodiment, a sintered body containing SiC as a main component and having an oxygen content of 100 ppm or less, is placed in the crucible to be used as a container for a Si—C solution.

SiC, which is a main component of these, serves as a source of Si and C. Si and C are eluted by heating in a Si—C solution; however, since the oxygen content is 100 ppm or less, generation of a gas in the Si—C solution is suppressed. As a result, a high-quality SiC single crystal with few detects can be stably produced for a long time. The SiC single crystal thus obtained is suitably used as a SiC semiconductor device such as a power device. In other words, the SiC crucible and sintered body used in the present invention are suitable for use in producing a single crystal applicable to a SiC semiconductor device.

DESCRIPTION OF EMBODIMENTS

Figure 1:
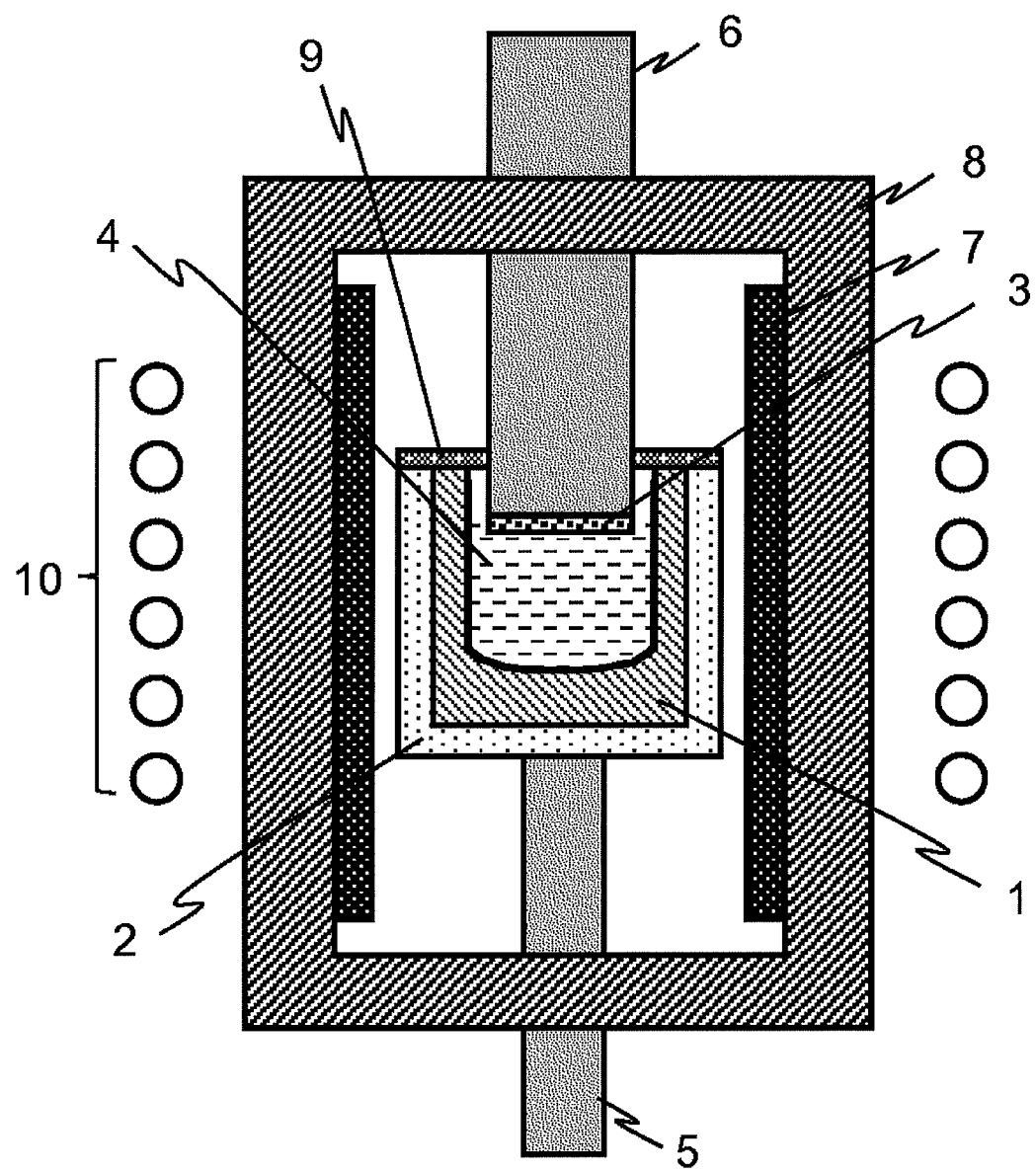
FIG. 1 is a view showing a first configuration example of a main part of an apparatus for growing a silicon carbide crystal in accordance with the method of the present invention.

Now, referring to the drawings, the method of producing a SiC single crystal according to the present invention will be described. Note that, in the following description, an embodiment where a crucible is heated at a high frequency, will be described; however, the heating method is not limited to using high frequency. Another heating method such as resistance heating may be employed depending upon e.g., the temperature of a Si—C solution to be controlled.

In consideration of the aforementioned problems with conventional solution methods, the present inventors studied on a technique for obtaining a high-quality single crystal silicon carbide with few defects by not only reducing a composition variation of the Si—C solution but also suppressing precipitation of a polycrystal on the inner wall of a crucible.

According to the studies by the present inventors, it was found that a high-quality single crystal silicon carbide with few defects compared to conventional ones can be obtained by using a crucible (SiC crucible) containing SiC as a main component as a container for a Si—C solution, or placing a sintered body (SiC sintered body) containing SiC as a main component in a crucible to be used as a container for a Si—C solution; eluting Si and C derived from a main component, SiC of the crucible or sintered body from the surface of the SiC crucible or the SiC sintered body in contact with the Si—C solution into the Si—C solution; and bringing a SiC seed crystal from the top of the crucible into contact with the Si—C solution to allow a SiC single crystal to grow on the SiC seed crystal. The SiC single crystal thus obtained is suitable for use in a SiC semiconductor device such as a power device. In other words, the SiC crucible and sintered body used in the present invention are suitable for use in producing a single crystal applicable to a SiC semiconductor device.

The reason why a high-quality SiC single crystal can be stably obtained for a long time by the above method can be summarized as follows.

A conventional solution method includes using a crucible formed of a heat-resistant carbon material represented by a graphite crucible, putting a solution in the crucible and allowing C to elute from the crucible to supply C in the solution. However, as growth of a SiC crystal proceeds, a decrease of the composition ratio of a Si component in the solution inevitably occurs.

In contrast, in the above method, Si and C are supplied into the solution from a source, SiC, which is a main component of the SiC crucible and SiC sintered body. In this case, even if a SiC crystal is grown on a seed crystal, Si and C in the solution consumed by growth of the crystal are supplied from the SiC crucible or SiC sintered body. As a result, composition variation of the solution is suppressed, and a SiC single crystal can be grown stability for a long time.

Such a crystal growth method is analogous to the FZ method or can be said a kind of FZ method. In the FZ method, melting of a polycrystal part and growth of a single crystal part proceed via a Si melting part. Also in the above crystal growth method, a crucible or a sintered body corresponding to the polycrystal part is melted by heating and a SiC single crystal is grown on a seed crystal via a solution containing Si and C corresponding to the melting part above.

However, when the SiC single crystal thus obtained was more closely checked, many voids were observed in the crystal. The present inventors further investigated a cause to produce such voids and reached the conclusion that oxygen incorporated in a crucible or a sintered body containing SiC as a main component is the cause. Although specific mechanism is unknown, the present inventors are considering two possible mechanisms described below.

One of the mechanisms is: oxygen contained in a SiC crucible or a SiC sintered body forms an oxide (SiO). Since the boiling point of the SiO is in the vicinity of 1880° C., if the temperature of a Si—C solution is the boiling point or more, SiO eluted with elution of SiC is gasified in the Si—C solution, reaches the interface (solid-liquid interface) between the Si—C solution and a growing SiC single crystal and is incorporated in the surface of a growing crystal to form voids.

The other mechanism is: oxygen contained in a SiC crucible or a SiC sintered body elutes into a Si—C solution with elution of SiC. If the temperature of the Si—C solution is equal to or less than the boiling point of SiO, oxygen reacts with Si in the Si—C solution to form SiO. SiO reaches the interface (solid-liquid interface) of the Si—C solution and a growing SiC single crystal and is incorporated in the surface of a growing crystal to form voids.

Based on the finding, in the present invention, occurrence of voids is remarkably suppressed by controlling the oxygen content of a SiC crucible or a SiC sintered body to be 100 ppm or less.

More specifically, in the present invention, a SiC single crystal is allowed to grow on a SiC seed crystal by using a crucible containing SiC as a main component and having an oxygen content of 100 ppm or less, as a container for a Si—C solution in producing the SiC single crystal in accordance with a solution method; heating the crucible to allow Si and C (derived from a source, i.e., SiC, which is a main component of the crucible) to elute from a high temperature region of the crucible surface in contact with the Si—C solution, into the Si—C solution; and bringing the SiC seed crystal from the top of the crucible into contact with the Si—C solution.

In another embodiment, a SiC single crystal is allowed to grow on the SiC seed crystal by placing a sintered body containing SiC as a main component and having an oxygen content of 100 ppm or less in a crucible to be used as a container for a Si—C solution in producing the SiC single crystal in accordance with a solution method; heating the crucible to allow Si and C (derived from a source, i.e., SiC, which is a main component of the sintered body) to elute from the surface of the sintered body in contact with the Si—C solution; and bringing the SiC seed crystal from the top of the crucible into contact with the Si—C solution.

FIG. 1 is a view showing a first configuration example of a main part of an apparatus for growing a silicon carbide crystal in accordance with the method of the present invention.

In the figure, reference numeral 1 represents a crucible containing SiC as a main component, having an oxygen content of 100 ppm or less and serving as a container for a Si—C solution; reference numeral 2 represents a second crucible made of a heat-resistant carbon material and housing the SiC crucible 1; reference numeral 3 represents a SiC single crystal serving as a seed crystal; reference numeral 4 represents a Si—C solution put in the SiC crucible 1; reference numeral 5 represents a shaft for rotating the crucible 1 (and crucible 2) during crystal growth of SiC; reference numeral 6 represents a shaft for holding and rotating the seed crystal 3 during crystal growth of SiC; reference numeral 7 represents a susceptor formed of e.g., a graphite material; reference numeral 8 represents an insulating material formed also of e.g., a graphite material; reference numeral 9 represents a top cover for suppressing evaporation of the Si—C solution; and reference numeral 10 represents a high frequency coil for heating the SiC crucible 1 and providing a preferable temperature distribution within the SiC solution 4.

Note that, although not shown in the figure, an exhaust port and an exhaust valve for evacuating the air in the furnace; and a gas inlet and a gas inlet valve for introducing a gas are provided. To the SiC crucible 1 before heating is filled with Si and may be filled with Si together with a source for C.

Note that, in the embodiment shown in FIG. 1, a crucible containing SiC as a main component and having an oxygen content of 100 ppm or less is used as the crucible 1. However, a crucible made of e.g., graphite may be used in place of this as a container for a Si—C solution and a sintered body containing SiC as a main component and having an oxygen content of 100 ppm or less, may be placed in the crucible.

Figure 2:
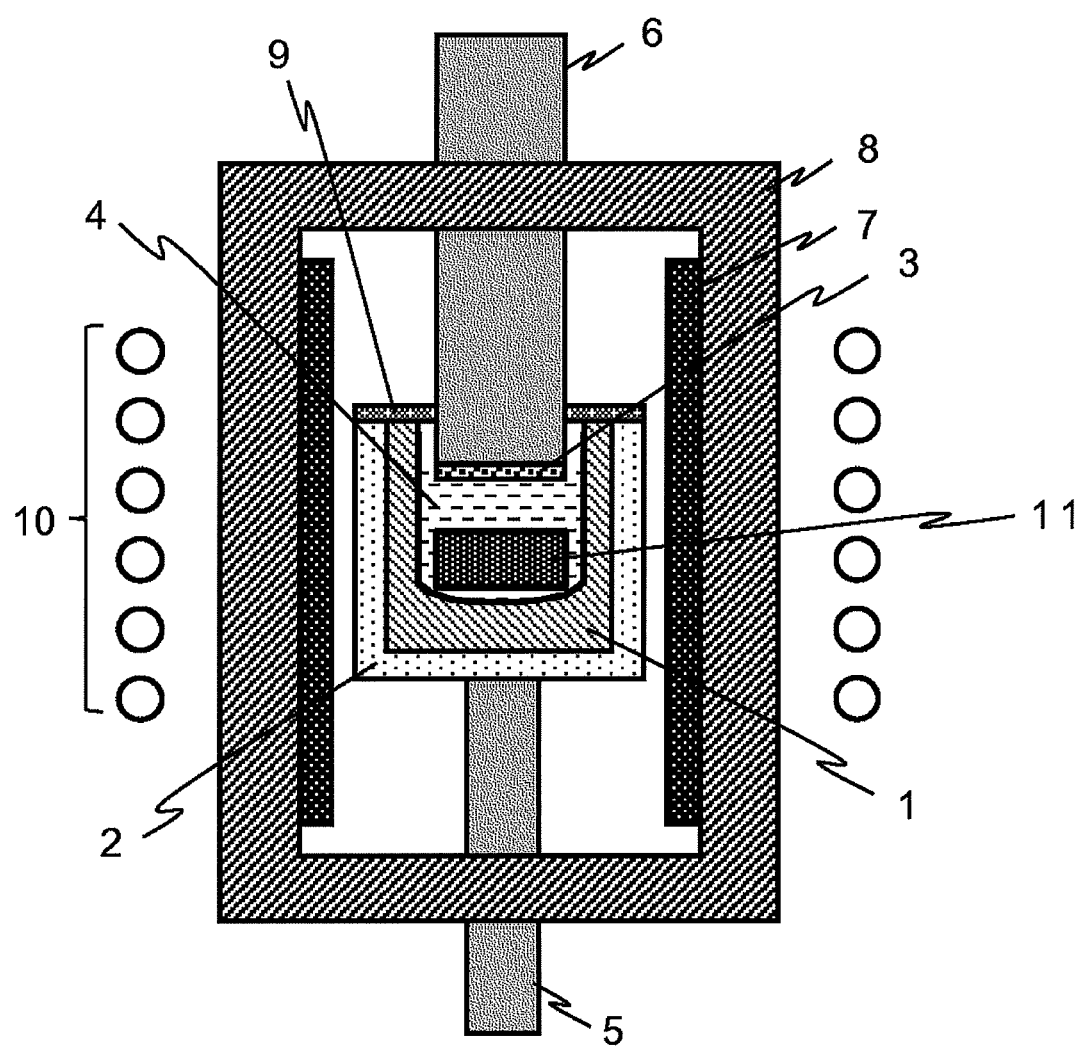
FIG. 2 is a view showing a second configuration example of a main part of an apparatus for growing a silicon carbide crystal in accordance with the method of the present invention.

FIG. 2 is a view showing a second configuration example of a main part of an apparatus for growing a silicon carbide crystal in accordance with the method of the present invention. In the figure, reference numeral 11 represents a sintered body (SiC sintered body) containing SiC as a main component and having an oxygen content of 100 ppm or less. In this embodiment, the crucible 1 may be the crucible containing SiC as a main component and having an oxygen content of 100 ppm or less, as is the case with the embodiment of FIG. 1, and may be a crucible of e.g., graphite.

Although the details will be described later, the SiC crucible and SiC sintered body are each produced by molding a SiC raw-material powder having an oxygen content of 2000 ppm or less, baking it to decrease the oxygen content thereof up to 100 ppm or less. If necessary, the crucible and sintered body are further subjected to a heat treatment for impregnating them with Si.

In the present invention, the oxygen content in a SiC crucible and a SiC sintered body for use in producing a SiC single crystal in accordance with a solution method is controlled to be 100 ppm or less, thereby suppressing void occurrence in the SiC single crystal to be grown. Such a SiC single crystal is suitable for use in a SiC semiconductor device such as a power derive. In other words, the SiC crucible and sintered body to be used in the present invention are suitable or producing a single crystal for use in SiC semiconductor devices.

If the oxygen content in a SiC crucible and a SiC sintered body is high, oxygen dissolved in a Si—C solution is converted into a gas through the reaction: e.g., O+Si→SiO↑ or O+C→CO↑, at the time of precipitation of a SiC single crystal on a seed crystal, attached to the seed crystal, inhibiting precipitation of the SiC single crystal. As a result, voids are formed in the SiC single crystal. Then, in the present invention, the oxygen content of the SiC crucible and SiC sintered body is specified as 100 ppm or less.

Note that, in the above configuration example, the second crucible 2 made of a heat-resistant carbon material is used for housing the crucible 1; however, the second crucible 2 is not necessarily required in the present invention. However, if use of the second crucible 2 is advantageous because the temperature distribution within the Si—C solution can be easily and preferably controlled.

In the present invention, owing to induction heating of the crucible 1 by the high frequency coil 10, a preferable temperature distribution of the Si—C solution 4 for crystal growth is provided; at the same time, Si and C derived from SiC as a main component are allowed to elute from the surface of the crucible 1 or the surface of the SiC sintered body 11 in contact with the Si—C solution 4, into the Si—C solution 4; and then, the SiC seed crystal 3 is brought from the top of the crucible 1 into contact with the Si—C solution 4 to allow a SiC single crystal to grow on the SiC seed crystal 3. The temperature of the Si—C solution during crystal growth is usually controlled to fall within the temperature range of 1300° C. to 2300° C.

Accordingly, at least the temperature of the inner wall of the crucible in contact with the Si—C solution, if a SiC crucible is used; and the surface temperature of the SiC sintered body in contact with the Si—C solution if the SiC sintered body is used, are each controlled be a sufficiently high temperature to allow constituent elements Si and C of SiC (main component of the crucible and sintered body) to elute in the Si—C solution 4. The temperature in the vicinity of the solid-liquid interface between the SiC seed crystal 3 and the Si—C solution 4 is controlled to be a sufficient temperature for a SiC single crystal to grow on the SiC seed crystal 3.

Figure 3:
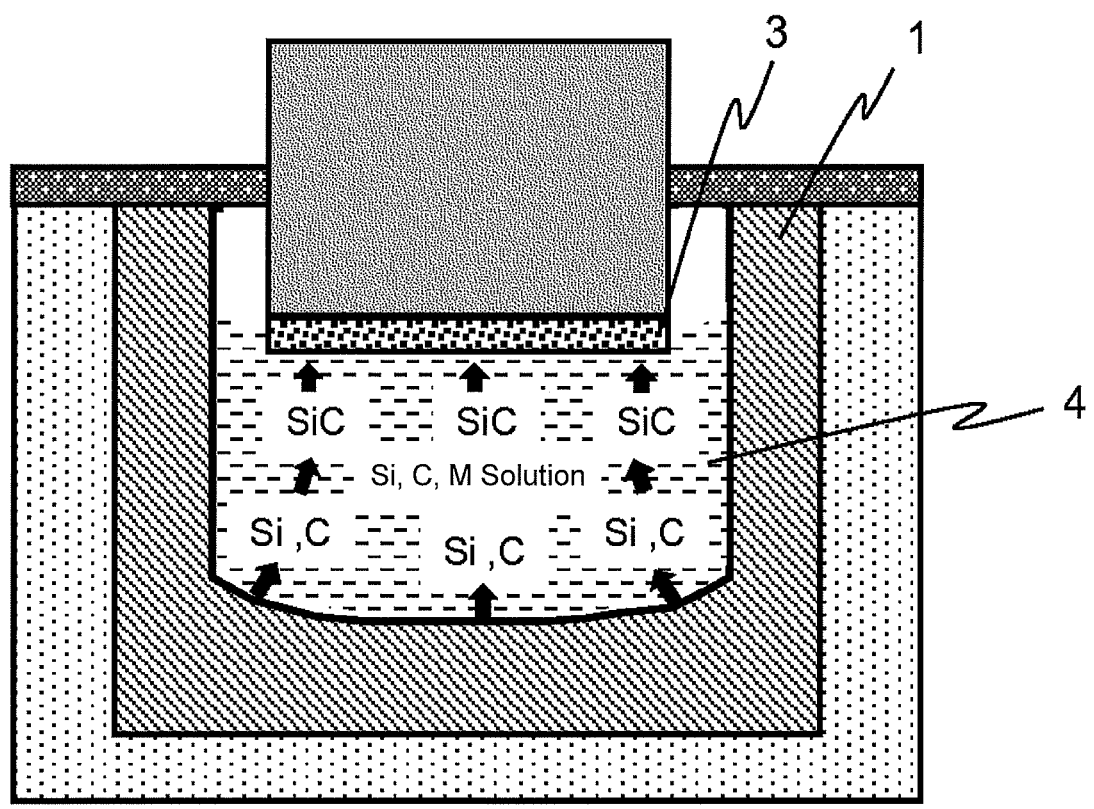
FIG. 3 is a conceptual view for describing how to elute Si and C into a Si—C solution from the wall surface of a SiC crucible during growth of silicon carbide crystal according to the method of the present invention.

FIG. 3 is a conceptual view for describing how to elute Si and C into a Si—C solution from the wall surface of a SiC crucible during the growth of a silicon carbide crystal according to the method of the present invention.

If the temperature distribution as mentioned above is provided, Si and C derived from SiC (a main component of the SiC crucible 1) elute into the Si—C solution 4 from the surface (high temperature region) of the SiC crucible 1 in contact with the Si—C solution 4. Naturally, the Si and C thus eluted newly serve as Si component and C component in the Si—C solution 4 and as sources for a single crystal to be grown on the SiC seed crystal 3. Note that, reference symbol M in the figure represents a metal element having an effect of enhancing the solubility of C to the Si—C solution 4. The metal element to be added is not limited to a singly type. A plurality of types of metal elements may be added.

In the environment where Si and C are eluted into the Si—C solution 4 from the SiC crucible 1, a problem of precipitation of a SiC polycrystal on the surface of the crucible in contact with the Si—C solution, does not occur. This is because, in the environment where SiC (a main component of the crucible 1) is eluted as Si and C into the Si—C solution 4, there is no possibility that Si and C are precipitated as SiC. In other words, precipitation of a SiC polycrystal on the surface of the crucible in contact with the Si—C solution is suppressed by using a crucible containing SiC as a main component as the container for a Si—C solution.

In addition, use of the SiC crucible is effective since formation of a metal carbide, which is formed by binding an additive metal element M and carbon C, is suppressed. In the case of using a graphite crucible, if the ratio of a Si composition in the Si—C solution decreases or if the Si/C (composition) ratio is lowered by excessive dissolution of C into the solution, a metal element M, which is added in order to facilitate dissolution of C, is easily combined to carbon C, with the result that a metal carbide tends to be formed. Such a metal carbide has a high melting point, moves through the Si—C solution while floating, reaches the portion in the vicinity of the surface of a seed crystal and serves as a factor of inhibiting crystallization of a SiC single crystal. In contrast, in the case of using a SiC crucible, carbon C is not excessively dissolved in the Si—C solution, with the result that the formation of a metal carbide is suppressed and the SiC single crystal to be grown can be easily crystallized.

As described above, in the method of growing a silicon carbide crystal according to the present invention, use of a crucible containing SiC as a main component as a container for a Si—C solution is advantageous since precipitation of a SiC polycrystal on the surface of the crucible in contact with the Si—C solution is suppressed. If a SiC sintered body housed in a graphite crucible is used as a source for crystal growth in place of a SiC crucible, the above effect is low; however, since the SiC sintered body is housed in the graphite crucible, the contact area between the graphite crucible and the SiC solution decreases, with the result that this case has an effect of suppressing precipitation of a SiC polycrystal, compared to conventional methods.

Si and C are continuously eluted from the crucible; however, since a single crystal is grown usually by rotating the crucible and a seed crystal, the Si—C solution gets a stirring effect and the composition thereof can be homogenized. As a result, the state of the solution as shown in FIG. 3 can be realized.

Note that the conditions of the induction heating by the high frequency coil 10 are appropriately controlled during a process for growing a SiC single crystal to obtain a suitable temperature distribution. Furthermore, if the position of the crucible 1 is moved up and down and/or the crucible 1 and the seed crystal 3 are rotated, the growth rate of a SiC single crystal and the elution rate of Si and C into the SiC solution 4 can be properly controlled. Moreover, if Si and C, which are consumed from the Si—C solution 4 as the growth of the SiC single crystal proceeds, are solely supplied from the crucible 1, the composition variation of the Si—C solution 4 can be suppressed. The same can apply to the case where a SiC sintered body is used in place of SiC crucible.

As mentioned above, the metal element represented by M in FIG. 3 and having an effect of enhancing the solubility of C to the Si—C solution 4 is not limited to a single type. A plurality of types of metal elements may be added.

As such a metal element, at least one metal element selected from the group consisting of, for example, La, Ce, Pr, Nd, Sm, Eu, Gd, Tb, Dy, Ho and Lu, can be mentioned.

At least one type of metal element selected from the group consisting of, for example, Ti, V, Cr, Mn, Fe, Co, Ni and Cu, can be mentioned.

Further, at least one type of metal element selected from the group consisting of, for example, Al, Ga, Ge, Sn, Pb and Zn, can be mentioned.

Note that, the above metal elements may be used in combination. For example, at least one metal element M1 selected from the group consisting of La, Ce, Pr, Nd, Sm, Eu, Gd, Tb, Dy, Ho and Lu may be used in combination with at least one metal element M2 selected from the group consisting of Ti, V, Cr, Mn, Fe, Co, Ni and Cu.

The total addition amount of such metal elements in the Si—C solution usually falls within the range of 1 at % to 80 at %.

For example, the content of the first metal element M1 in the Si—C solution is specified as 10 at % or more; whereas the content of the second metal element M2 in the Si—C solution is specified as 1 at % or more.

EXAMPLES

Now, the SiC crucible and SiC sintered body according to the present invention and methods of growing a SiC single crystal using these will be more specifically described by way of Examples.

Examples 1, 2 and Comparative Example 1, 2

SiC (D50:1.2 µm) manufactured by Shinano Electric Refining Co., Ltd., was used as a SiC raw-material powder, soaked in a 5% aqueous hydrogen fluoride solution for 30 minutes, filtered, rinsed with water and subjected to vacuum drying. Owing to the treatment, the oxygen content of the SiC powder, which was 2700 ppm (Comparative Example 1) before the hydrofluoric acid treatment; decreased to 1980 ppm (Example 1) after the hydrofluoric acid treatment.

Subsequently, to each of the SiC raw-material powders before and after the hydrofluoric acid treatment, boron carbide ($B_4C$) was added as a sintering aid in an amount of 0.5 wt % relative to the raw-material powder and methylcellulose (60SH50, manufactured by Shin-Etsu Chemical Co., Ltd.) was added as a binder in an amount of 3 wt % relative to the raw-material powder, and further water was added in an appropriate amount, and the resultant mixture was granulated.

The granulated powder was placed in a crucible-form rubber mold (for forming a molding having an inner diameter of 60 mm and a height of 80 mm) and subjected to integral molding under hydrostatic press.

The resultant sintered body was degreased at 400° C. under vacuum and baked in an argon atmosphere at 2200° C. for 6 hours to obtain a SiC crucible having an inner diameter 50 mm and a height of 70 mm (relative density 96%).

At the same time, an analytical test piece of ϕ20 mm×t5 mm was simultaneously baked to know the oxygen content in the SiC crucible.

The test piece was analyzed by glow discharge mass spectrometry (GDMS). As a result, the oxygen content of the SiC powder not treated with hydrofluoric acid and baked (Comparative Example 2) was 160 ppm; whereas, the oxygen content of the SiC powder treated with hydrofluoric acid and baked (Example 2) decreased up to 80 ppm.

The reason why the oxygen content decreased by baking is that boron carbide added as an auxiliary agent and a binder are carbonized in an inert atmosphere and the oxygen content is reduced during the process of sintering SiC. However, in the case where a SiC powder having a high oxygen concentration before a baking process, oxygen reduction does not sufficiently proceed during the baking process, with the result that the oxygen content after the baking process is higher just by the insufficient reduction of oxygen.

Using SiC crucibles (Example 2 and Comparative Example 2) produced in the aforementioned manner, growth of a SiC single crystal was tried from a Si—C solution containing La (20 at %) and Cr (20 at %) and Si as the remainder (balance).

Note that, the initial supply amounts of components to the crucible were determined based on various density calculations and the depth of a solvent was controlled to be 27 mm. As a seed crystal, a single crystal (polytype: 4H) having a size of $\phi21$ mm×t0.4 mm and bonded to a seed shaft ($\phi19$ mm) made of graphite arranged such that a crystal was grown on the C surface, was used.

A crystal was grown in the conditions, i.e., an argon atmosphere, at 2000° C. for 10 hr, at a pulling rate of 0.1 mm/hr while rotating the crucible at 20 rpm and the seed shaft at 20 rpm such that they rotate in the opposite direction. After growth, the crystal was taken out and a cross-section thereof was observed. As a result, many voids were observed in the cross-section of the grown crystal in the case of the SiC crucible (Comparative Example 2) having an oxygen amount of 160 ppm; whereas no voids were formed in the case of the SiC crucible (Example 2) having an oxygen amount of 80 ppm.

Figure 4A:
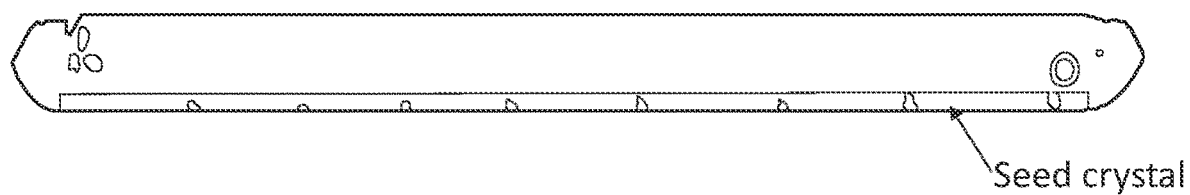
FIG. 4 shows an optical photograph (FIG. 4 (A)) of a cross-section of the crystal obtained in Example 2 and an optical photograph (FIG. 4(B)) of a surface thereof.
Figure 4B:
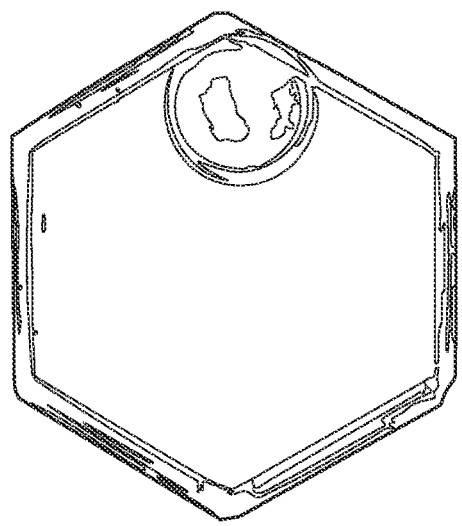
Figure 5A:
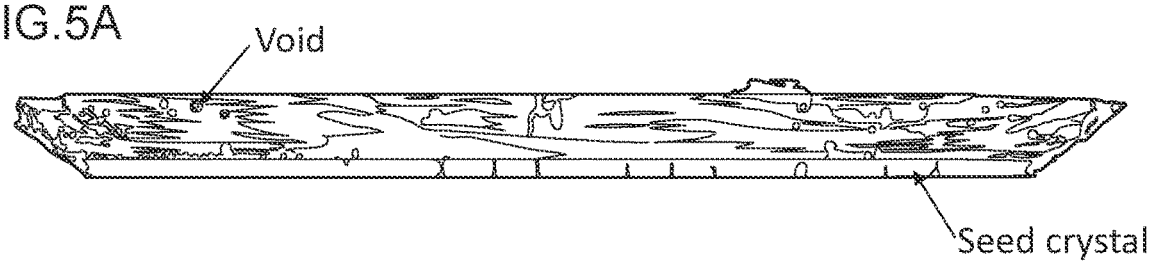
FIG. 5 shows an optical photograph (FIG. 5 (A)) of a cross-section of the crystal obtained in Comparative Example 2 and an optical photograph (FIG. 5 (B)) of a surface thereof.
Figure 5B:
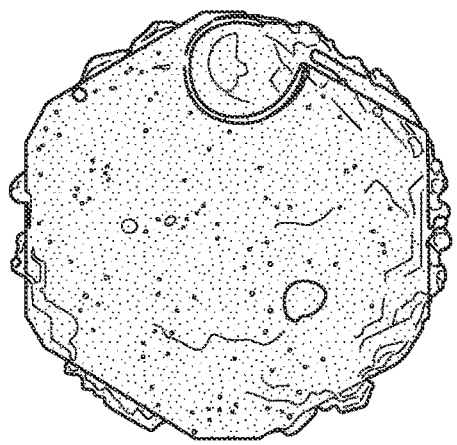

FIG. 4(A) and FIG. 4(B) are optical photographs of a cross-section of the crystal obtained in Example 2 and the surface thereof. FIG. 5(A) and FIG. 5(B) are optical photographs of a cross-section of the crystal obtained in Comparative Example 2 and the surface thereof. Many voids (indicated by arrows) are observed in the photographs of the crystal obtained in Comparative Example 2; whereas, no voids are observed in the photographs of the crystal obtained in Example 2.

As mentioned above, the SiC crucible of Comparative Example 2 contains 160 ppm of oxygen. There is a high possibility that the oxygen formed a compound with Si. This reacts with Si in the Si—C solution to produce SiO. Since the boiling point of SiO is 1880° C., there is a high possibility that SiO is gasified in the Si—C solution and acts as a cause to form voids.

Provided that 50 g of the SiC crucible is eluted as a Si—C solution, theoretically, 4 ml of SiO gas is to be generated. The amount of SiO gas is presumably sufficient for forming voids. In other words, Occurrence of voids is conceivably suppressed by reducing the amount of oxygen contained in the SiC crucible. The same can apply to the case where a SiC sintered body, different in shape from the crucible, was used.

Example 3 and Comparative Examples 3, 4

In the same manner as in Examples mentioned above, SiC (D50:1.2 μm) manufactured by Shinano Electric Refining Co., Ltd. was used as a SiC raw-material powder, soaked in a 5% aqueous hydrogen fluoride solution for 30 minutes, filtered, rinsed with water, and subjected to vacuum drying. Subsequently, Demol EP (manufactured by Kao Corp.) as a dispersant was added in an amount of 0.05 wt % relative to the weight of to the SiC powder and water was appropriately added to prepare slurry.

The slurry was poured in a plaster mold (size $\phi100\times$height 100 mm) and molded into a crucible in accordance with a slip casting method. After drying, the crucible was baked in an Ar atmosphere at 2200° C. for 6 hours to obtain a SiC crucible having an inner diameter of 80 mm and a height of 90 mm (relative density 76%).

Note that the density is low compared to the crucible of Example 2 because boron carbide ($B_4C$) serving as a sintering aid is not used in order to obtain low-density SiC.

After the amount of Si corresponding to the void content of the resultant low-density SiC crucible was calculated, Si was added to the crucible and then the crucible was baked in an Ar atmosphere at 1800° C. for 10 hr to impregnate the crucible with Si.

At this time, an analytical test piece of $\phi20$ mm×t5 mm was simultaneously baked in order to know the oxygen content in the SiC crucible.

The test piece was analyzed by glow discharge mass spectrometry (GDMS). As a result, the oxygen content of the crucible not impregnated with Si (Comparative Example 3) was 160 ppm; whereas, the oxygen content of the crucible impregnated with Si (Example 3) decreased up to 15 ppm. Note that, since no sintering aid was added, boron, which serves as a dopant in a SiC single crystal was not detected in any one of the crucibles.

The reason why the oxygen content decreased up to about one-tenth by impregnation with Si is considered that an oxygen compounds (e.g., SiO2) present on and in SiC grains of a SiC sintered body and oxygen contained in SiC itself in the form of solid solution come to be in contact with a melted Si metal and reduces the Si metal; more specifically, oxygen was removed through the reaction: $SiO_2+Si\rightarrow 2SiO\uparrow$ or $O+Si\rightarrow SiO\uparrow$. Since the boiling point of SiO is 1880° C., SiO is evaporated and removed in gaseous form from the crucible and the sintered body, with the result that the amount of oxygen is reduced.

Using the SiC crucible (Example 3) produced in the aforementioned manner, growth of a SiC single crystal was tried from a Si—C solution containing La (20 at %) and Cr (20 at %) and Si as the remainder (balance). The SiC crucible was housed in a second crucible made of a heat-resistant carbon material, graphite. This is made in order to control the temperature distribution in the Si—C solution during crystal growth to be suitable one as well as in consideration of possibility that Si added to the SiC crucible by impregnation may ooze out in the outer periphery.

Note that, the initial supply amounts of components to the crucible were determined based on various density calculations and the depth of a solvent was controlled to be 27 mm. As a seed crystal, a single crystal (polytype: 4H) having a size of $\phi2$ inches×t0.4 mm and bonded to a seed shaft ($\phi47$ mm) made of graphite arranged such that a crystal was grown on the C surface, was used. A crystal was grown in the conditions, i.e., an argon atmosphere, 2000° C. for 20 hr, at a pulling rate of 0.1 mm/hr while rotating the crucible at 20 rpm and the seed shaft at 20 rpm such that they rotate in the opposite direction.

For comparison, a SiC single crystal was grown (Comparative Example 4) in the same conditions as above except that a SiC sintered crucible ($\phi90/80\times H90/80$ mm, theoretical density: 96%) manufactured by Nippon Fine Ceramics Co., Ltd. and having an oxygen content of 160 ppm was used.

Figure 6A:
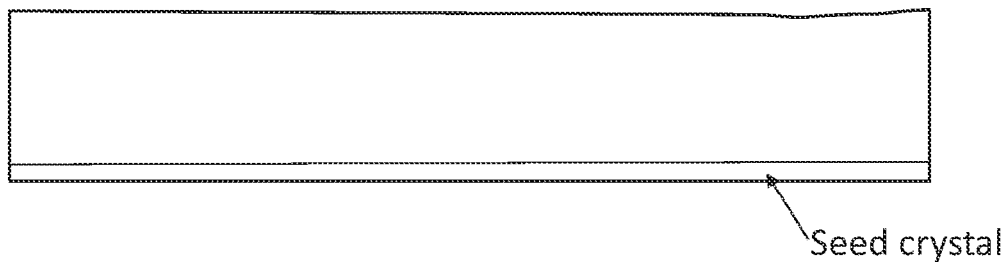
FIG. 6 shows an optical photograph (FIG. 6 (A)) of a cross-section of the crystal obtained in Example 3 and an optical photograph (FIG. 6(B)) of a surface thereof.
Figure 6B:
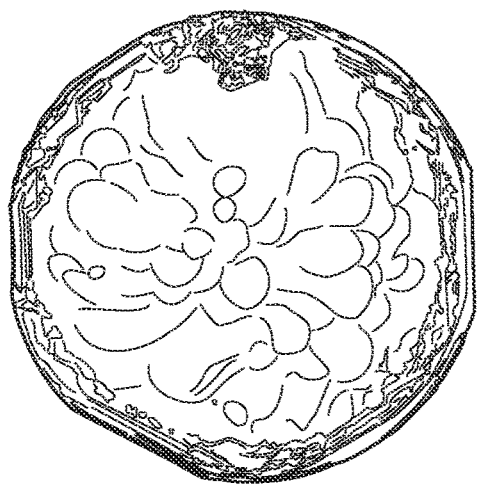
Figure 7A:
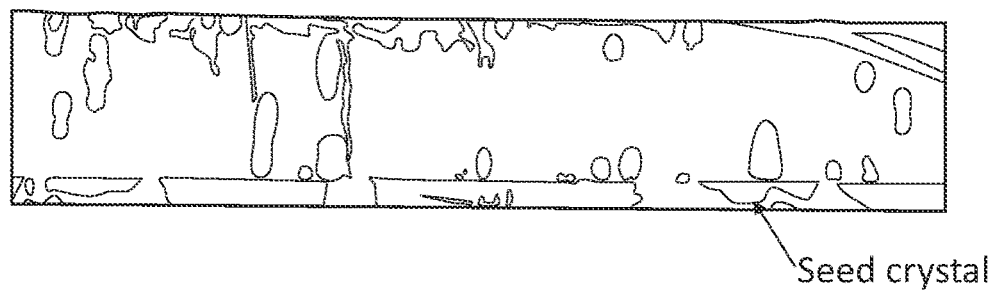
FIG. 7 shows an optical photograph (FIG. 7 (A)) of a cross-section of the crystal obtained in Comparative Example 4 and an optical photograph (FIG. 7 (B)) of a surface thereof.
Figure 7B:
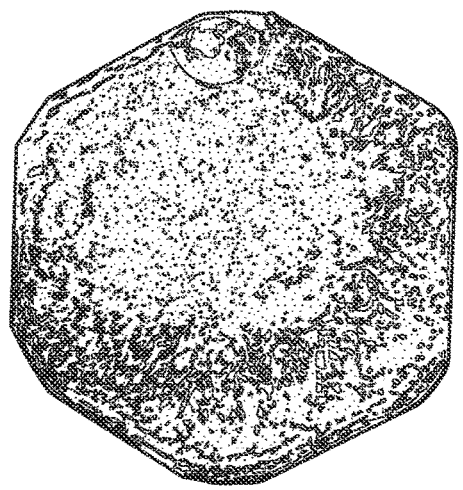

FIG. 6(A) and FIG. 6(B) are optical photographs of a cross-section of the crystal obtained in Example 3 and the surface thereof. FIG. 7(A) and FIG. 7(B) are optical photographs of a cross-section of the crystal obtained in Comparative Example 4 and the surface thereof. Many voids are observed in the photographs of the crystal obtained in Comparative Example 4; whereas, no voids are observed in the photographs of the crystal obtained in Example 3.

Table 1 summarizes oxygen contents (ppm) of Examples 1 to 3 and Comparative Examples 1 to 4 and the presence or absence of voids.

TABLE 1

| | Shape | Oxygen content | Voids |
|---|---|---|---|
| Example 1 | SiC powder treated with hydrofluoric acid | 1980 | — |
| Example 2 | Sic crucible treated with hydrofluoric acid | 80 | Absent |
| Example 3 | Sic crucible impregnated with Si | 15 | Absent |
| Comparative Example 1 | SiC powder not treated | 2700 | — |
| Comparative Example 2 | SiC crucible not treated | 160 | Present |
| Comparative Example 3 | Low-density SiC crucible | 160 | — |
| Comparative Example 4 | SiC sintered crucible manufactured by Nippon Fine Ceramics Co., Ltd. | 160 | Present |

Examples 4, 5 and Comparative Examples 5, 6

In order to clarify the relationship between the oxygen amount in a SiC crucible and void occurrence, SiC crucibles having an oxygen content of 14 to 360 ppm were prepared (Examples 4, 5 and Comparative Examples 4 to 6) and a crystal growth test was carried out in the same conditions as in Comparative Example 4. Cross-sections of the resultant crystals were observed with respect to the presence or absence of voids and the number of voids were counted.

Figure 8A:
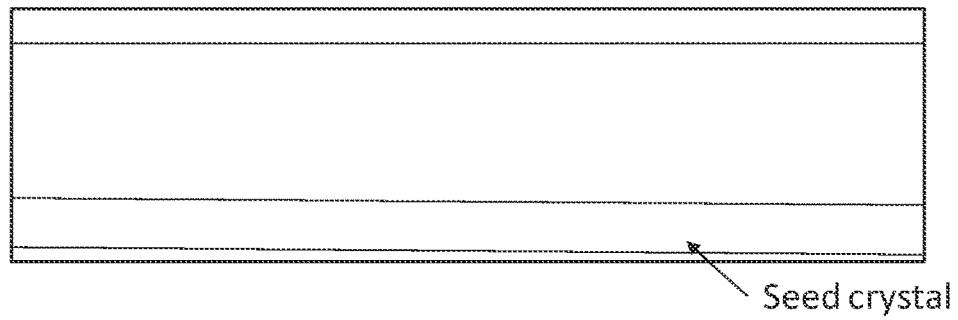
FIG. 8 shows optical photographs of cross-sections of the crystals obtained in Example 4 (FIG. 8 (A)), Example 5 (FIG. 8(B)), Comparative Example 5 (FIG. 8(C)) and Comparative Example 6 (FIG. 8(D)).
Figure 8B:
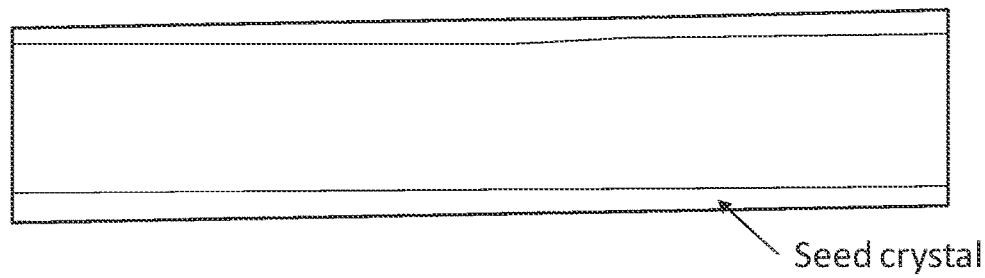
Figure 8C:
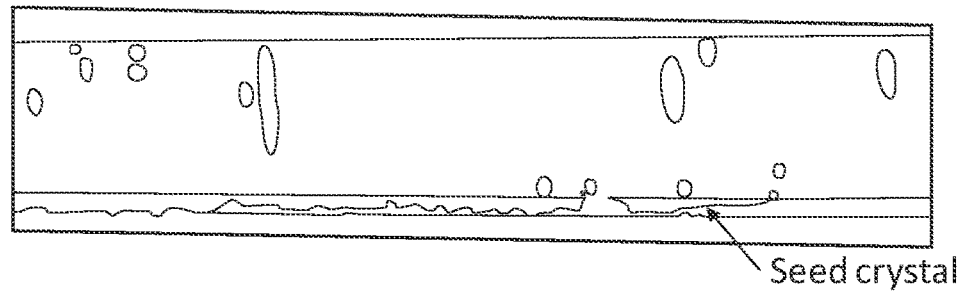
Figure 8D:
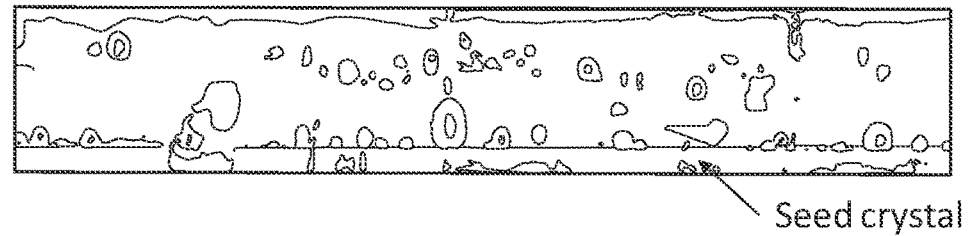

FIGS. 8(A) to (D) show optical photographs of cross-sections of the crystals obtained in Example 4 (FIG. 8(A)), Example 5 (FIG. 8(B)), Comparative Example 5 (FIG. 8(C)), and Comparative Example 6 (FIG. 8(D)).

Figure 9:
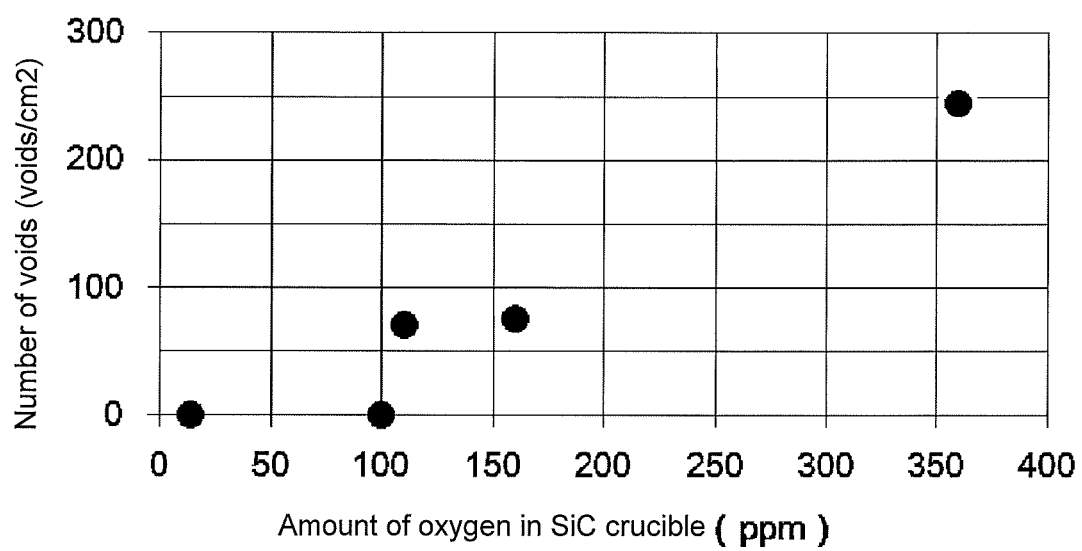
FIG. 9 is a graph showing the relationship between the concentration of oxygen contained in a SiC crucible and the density of voids in a crystal.

FIG. 9 is a graph showing the relationship between the concentration of oxygen contained in a SiC crucible and the density of voids in a crystal summarizing the above results.

Table 2 summarizes the relationship between the oxygen amount in a SiC crucible of each of Examples and Comparative Examples and the void density thereof.

TABLE 2

| Sample | Oxygen content (ppm) | Void density (cm$^{-2}$) |
|---|---|---|
| Comparative Example 4 | 160 | 75 |
| Comparative Example 5 | 110 | 70 |
| Comparative Example 6 | 360 | 245 |
| Example 4 | 100 | 0 |
| Example 5 | 14 | 0 |

According to these results, it was found that voids are formed in the case of a SiC crucible in which the concentration of oxygen in the SiC crucible exceeds 100 ppm. In particular, many voids were observed over the entire section of a crystal in the case where the concentration of oxygen was 360 ppm.

In contrast, in the case where the concentration of oxygen was 100 ppm or less, void occurrence was not observed.

From these results, it was found that void occurrence can be suppressed by reducing the amount of oxygen in a SiC crucible to 100 ppm or less. The conclusion derived from the results applies to the case where a SiC sintered body is used.

As mentioned above, according to the method of growing a silicon carbide crystal of the present invention, a high-quality single crystal silicon carbide with few defects can be obtained compared to a conventional method using a graphite crucible.

INDUSTRIAL APPLICABILITY

The present invention provides a high-quality single crystal silicon carbide with few defects. Such a SiC single crystal is suitable for a SiC semiconductor device such as a power derive. In short, the SiC crucible and sintered body to be used in the present invention is suitable for producing a single crystal to be used in SiC semiconductor devices.

REFERENCE SIGNS LIST

1 Crucible containing SiC as a main component
2 Second crucible formed of a heat-resistant carbon material
3 Seed crystal
4 Si—C solution
5 Crucible rotation shaft
6 Seed crystal rotation shaft
7 Susceptor
8 Insulation material
9 Top cover
10 High frequency coil
11 SiC sintered body

The invention claimed is:

1. A method of producing a SiC single crystal, which is a method of growing a silicon carbide crystal in accordance with a solution method, comprising
 using a crucible comprising SiC as a main component and having an oxygen content of 80 ppm or less as a container for a Si—C solution,
 heating the crucible to allow Si and C to elute from a high temperature region of a crucible surface in contact with the Si—C solution, into the Si—C solution, and
 bringing a SiC seed crystal from the top of the crucible into contact with the Si—C solution to allow a SiC single crystal to grow on the SiC seed crystal.

2. The method of producing a SiC single crystal according to claim 1, wherein a metal element M having an effect of enhancing solubility of C to the Si—C solution is added to the Si—C solution in advance.

3. The method of producing a SiC single crystal according to claim 2, wherein the metal M is at least one of a first metal element M1, which is at least one metal element selected from the group consisting of La, Ce, Pr, Nd, Sm, Eu, Gd, Tb, Dy, Ho and Lu, and a second metal element M2, which is at least one element selected from the group consisting of Ti, V, Cr, Mn, Fe, Co, Ni and Cu.

4. The method of growing a silicon carbide crystal according to claim 3, wherein the metal M consists of both the first metal element M1 and the second metal element M2, and the total content of the metal M in the Si—C solution is specified as 1 at % to 80 at %.

5. The method of growing a silicon carbide crystal according to claim 4, wherein the content of the first metal element M1 in the Si—C solution is specified as 10 at % or more; and the second metal element M2 in the Si—C solution is specified as 1 at % or more.

6. The method of producing a SiC single crystal according to claim 2, wherein the metal M is at least one metal element selected from the group consisting of Al, Ga, Ge, Sn, Pb and Zn.

7. The method of growing a silicon carbide crystal according to claim 1, wherein the temperature of the Si—C solution is controlled by the heating to fall in the range of 1300° C. to 2300° C.

8. The method of producing a SiC single crystal according to claim 1, wherein the heating is carried out in a state where the crucible is housed in a second crucible made of a heat-resistant carbon material.

9. The method of producing a SiC single crystal according to claim 1, wherein the crucible is heated by induction heating from a high frequency coil.

* * * * *